United States Patent
Kobayashi

(10) Patent No.: US 11,328,905 B2
(45) Date of Patent: May 10, 2022

(54) THERMAL SPRAYING METHOD OF COMPONENT FOR PLASMA PROCESSING APPARATUS AND COMPONENT FOR PLASMA PROCESSING APPARATUS

(71) Applicant: Tokyo Electron Limited, Tokyo (JP)

(72) Inventor: Yoshiyuki Kobayashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 31 days.

(21) Appl. No.: 16/028,607

(22) Filed: Jul. 6, 2018

(65) Prior Publication Data

US 2019/0019654 A1 Jan. 17, 2019

(30) Foreign Application Priority Data

Jul. 13, 2017 (JP) .............................. JP2017-137323

(51) Int. Cl.
*C23C 4/134* (2016.01)
*H01J 37/32* (2006.01)
(Continued)

(52) U.S. Cl.
CPC ........ *H01J 37/32449* (2013.01); *C23C 4/134* (2016.01); *C23C 16/45565* (2013.01);
(Continued)

(58) Field of Classification Search
CPC .... C23C 4/01; C23C 4/10; C23C 4/11; C23C 4/134; C23C 16/5096; C23C 16/45565; H05H 1/26; H05H 1/34; H05H 1/42; H01J 37/332449; H01J 37/32724; H01J 37/3252; H01J 2237/3328; H01J 37/32449; H01J 37/32522; H01J 37/32174; H01L 21/6831;
(Continued)

(56) References Cited

U.S. PATENT DOCUMENTS 4,853,250 A * 8/1989 Boulos ...................... C23C 4/12
427/446
5,691,018 A * 11/1997 Kelley ................ B05B 13/0228
428/36.8
(Continued)

FOREIGN PATENT DOCUMENTS

JP S63-157850 6/1988
JP 2004-349664 12/2004
(Continued)

*Primary Examiner* — Dah-Wei D. Yuan
*Assistant Examiner* — Nga Leung V Law
(74) *Attorney, Agent, or Firm* — IPUSA, PLLC

(57) ABSTRACT

There is provision of a thermal spraying method of a component for a plasma processing apparatus performed by a plasma spraying apparatus including a nozzle and a plasma generating unit having a common axis with the nozzle. The method includes a step of injecting, with a plasma generating gas, feedstock powder having a particle diameter of 15 μm or less from a tip of the nozzle to the plasma generating unit, a step of generating a plasma from the plasma generating gas in the plasma generating unit, by using electric power not more than 50 kW, and a step of thermal spraying the feedstock powder liquefied by the plasma at the component through a mask, such that a surface of a resin layer of the component is covered with the feedstock powder.

14 Claims, 13 Drawing Sheets

(51) Int. Cl.
*H01L 21/683* (2006.01)
*C23C 16/455* (2006.01)
*C23C 16/509* (2006.01)
*H01L 21/67* (2006.01)

(52) U.S. Cl.
CPC .... *C23C 16/5096* (2013.01); *H01J 37/32522* (2013.01); *H01J 37/32724* (2013.01); *H01L 21/67109* (2013.01); *H01L 21/6831* (2013.01); *H01L 21/6833* (2013.01); *H01J 2237/3328* (2013.01)

(58) Field of Classification Search
CPC ........... H01L 21/67109; H01L 21/6833; H01L 21/02225; H01L 21/67017; H01L 21/56; H01L 21/02307; H01L 21/6715; H01L 24/26
See application file for complete search history.

(56) References Cited

U.S. PATENT DOCUMENTS

| | | | |
|---|---|---|---|
| 7,622,160 B2 * | 11/2009 | Gupta | C23C 4/11 427/448 |
| 2002/0012743 A1 * | 1/2002 | Sampath | C23C 24/04 427/58 |
| 2005/0042881 A1 * | 2/2005 | Nishimoto | H01L 21/67248 438/710 |
| 2005/0181222 A1 * | 8/2005 | Cox | C23C 8/04 428/447 |
| 2008/0308230 A1 * | 12/2008 | Takahashi | H01J 37/32431 156/345.52 |
| 2011/0091700 A1 | 4/2011 | Simpson | |
| 2015/0075714 A1 * | 3/2015 | Sun | H01J 37/32477 156/345.1 |
| 2016/0074887 A1 * | 3/2016 | Kitamura | H05H 1/44 239/79 |

FOREIGN PATENT DOCUMENTS

| | | |
|---|---|---|
| JP | 2005-033181 | 2/2005 |
| JP | 2007-081218 | 3/2007 |
| JP | 2008-117982 | 5/2008 |
| JP | 2010-110669 | 5/2010 |
| JP | 2011-524944 | 9/2011 |
| JP | 2016-065302 | 4/2016 |
| JP | 2016-539250 | 12/2016 |

* cited by examiner

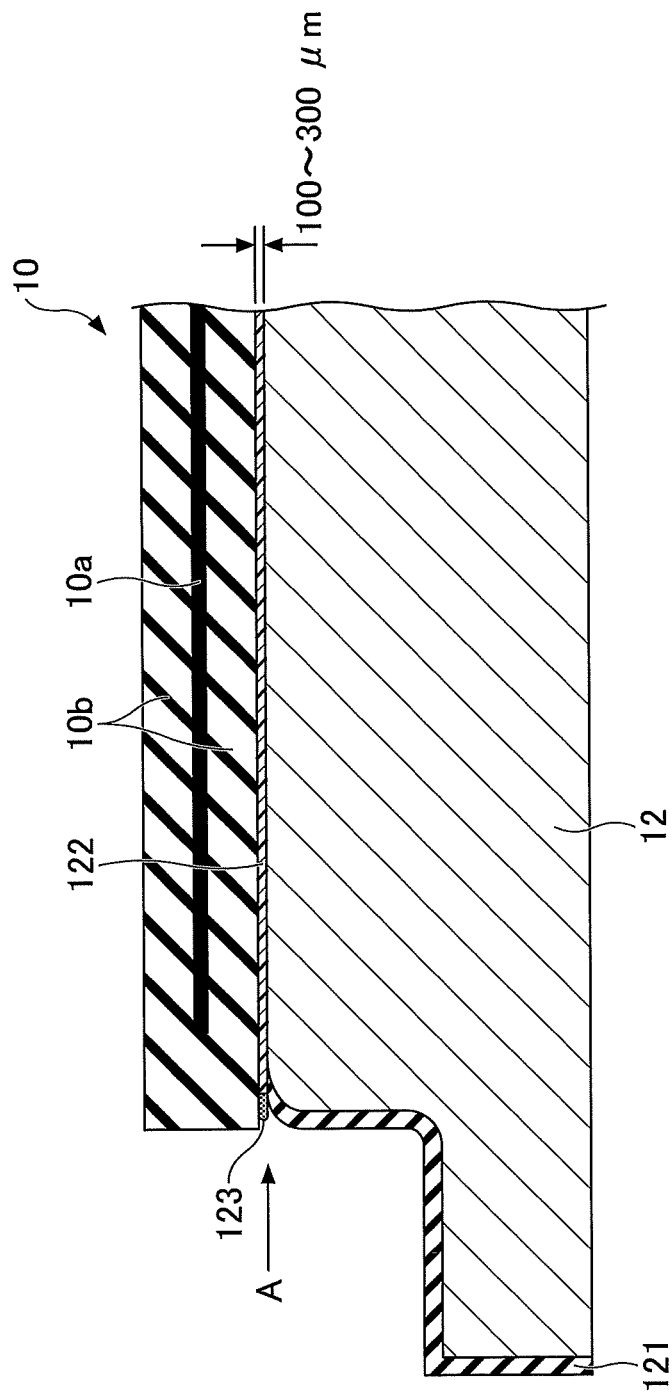

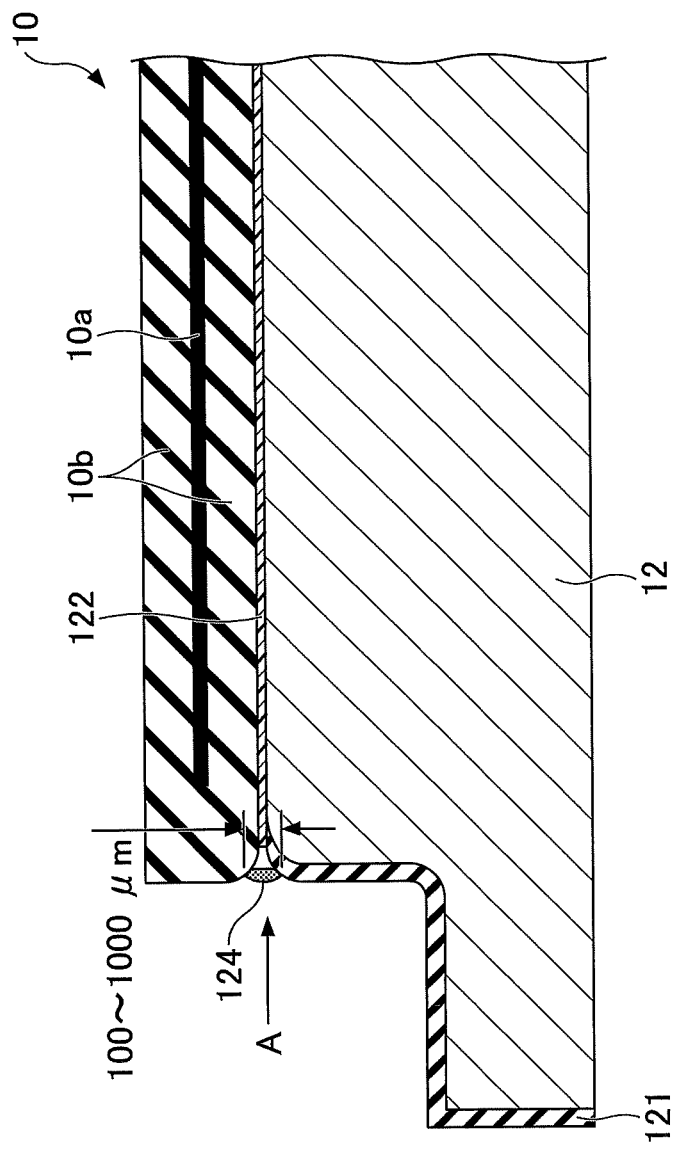

POWDER IS SUPPLIED FROM OUTSIDE

| POWER (VOLTAGE/CURRENT) | 70 V/500 A |
|---|---|
| SUPPLIED GAS | Ar, $H_2$ |
| PARTICLE DIAMETER OF FEEDSTOCK POWDER | 30~100 $\mu$m |
| FEED AMOUNT | Several tens of g/min |

POWDER IS SUPPLIED FROM AXIS

| POWER (VOLTAGE/CURRENT) | 30 V/200 A |
|---|---|
| SUPPLIED GAS | Ar, ($H_2$) |
| PARTICLE DIAMETER OF FEEDSTOCK POWDER | 15 μm or less |
| FEED AMOUNT | Several g/min |

FIG.8

| TYPE OF ADHESIVE | RESULT OF THERMAL SPRAYING (slit of 150 $\mu$m width) |
|---|---|
| SILICONE RESIN | ○ |
| ACRYLIC RESIN | ○ |
| EPOXY RESIN | ○ |

THERMAL SPRAYING METHOD OF COMPONENT FOR PLASMA PROCESSING APPARATUS AND COMPONENT FOR PLASMA PROCESSING APPARATUS

CROSS-REFERENCE TO RELATED APPLICATIONS

This patent application is based upon and claims the benefit of priority of Japanese Patent Application No. 2017-137323 filed on Jul. 13, 2017, the entire contents of which are incorporated herein by reference.

BACKGROUND OF THE INVENTION

1. Field of the Invention

The present invention generally relates to a thermal spraying method of a component for a plasma processing apparatus and the component for the plasma processing apparatus.

2. Description of the Related Art

A mounting base is configured such that an electrostatic chuck is disposed on an aluminum base member, and the electrostatic chuck is adhered to the base member via an adhesive agent that can mitigate stress (see Patent Document 1, for example). However, because an adhesive agent does not have high plasma resistance, part of the adhesive agent exposed to plasma, which is located between the base member and the electrostatic chuck, is worn down. If the adhesive agent is worn down, the life of the electrostatic chuck becomes shorter and the electrostatic chuck needs to be replaced. Because of the replacement of an electrostatic chuck, maintenance time and cost of a plasma processing apparatus increase.

To prevent an adhesive agent, exposed from a gap between a base member and an electrostatic chuck, from being worn out by plasma, one possible approach may be to coat the exposed part of the adhesive agent with material having high plasma resistance.

However, a width of a gap in which an adhesive agent is exposed is narrow (several hundred micrometers, for example). Therefore, it is difficult to coat the narrow gap of several hundred micrometers width with material having high plasma resistance.

CITATION LIST

Patent Document

[Patent Document 1] Japanese Laid-open Patent Application Publication No. 2004-349664

SUMMARY OF THE INVENTION

In one aspect, the present invention aims at protecting an adhesive agent exposed from a gap between two members.

To solve the above problem, according to an aspect of the present invention, there is provision of a thermal spraying method of a component for a plasma processing apparatus performed by a plasma spraying apparatus including a nozzle and a plasma generating unit having a common axis with the nozzle. The method includes a step of injecting, with a plasma generating gas, feedstock powder having a particle diameter of 15 µm or less from a tip of the nozzle to the plasma generating unit, a step of generating a plasma from the plasma generating gas in the plasma generating unit, by using electric power not more than 50 kW, and a step of thermal spraying the feedstock powder liquefied by the plasma at the component through a mask, such that a surface of a resin layer of the component is covered with the feedstock powder.

BRIEF DESCRIPTION OF THE DRAWINGS

FIGS. 2A and 2B are diagrams each illustrating an example of a structure of an electrostatic chuck according to the present embodiment;

FIG. 8 is a diagram illustrating an example of an experimental result regarding types of adhesives.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Plasma Processing Apparatus]

Figure 1:
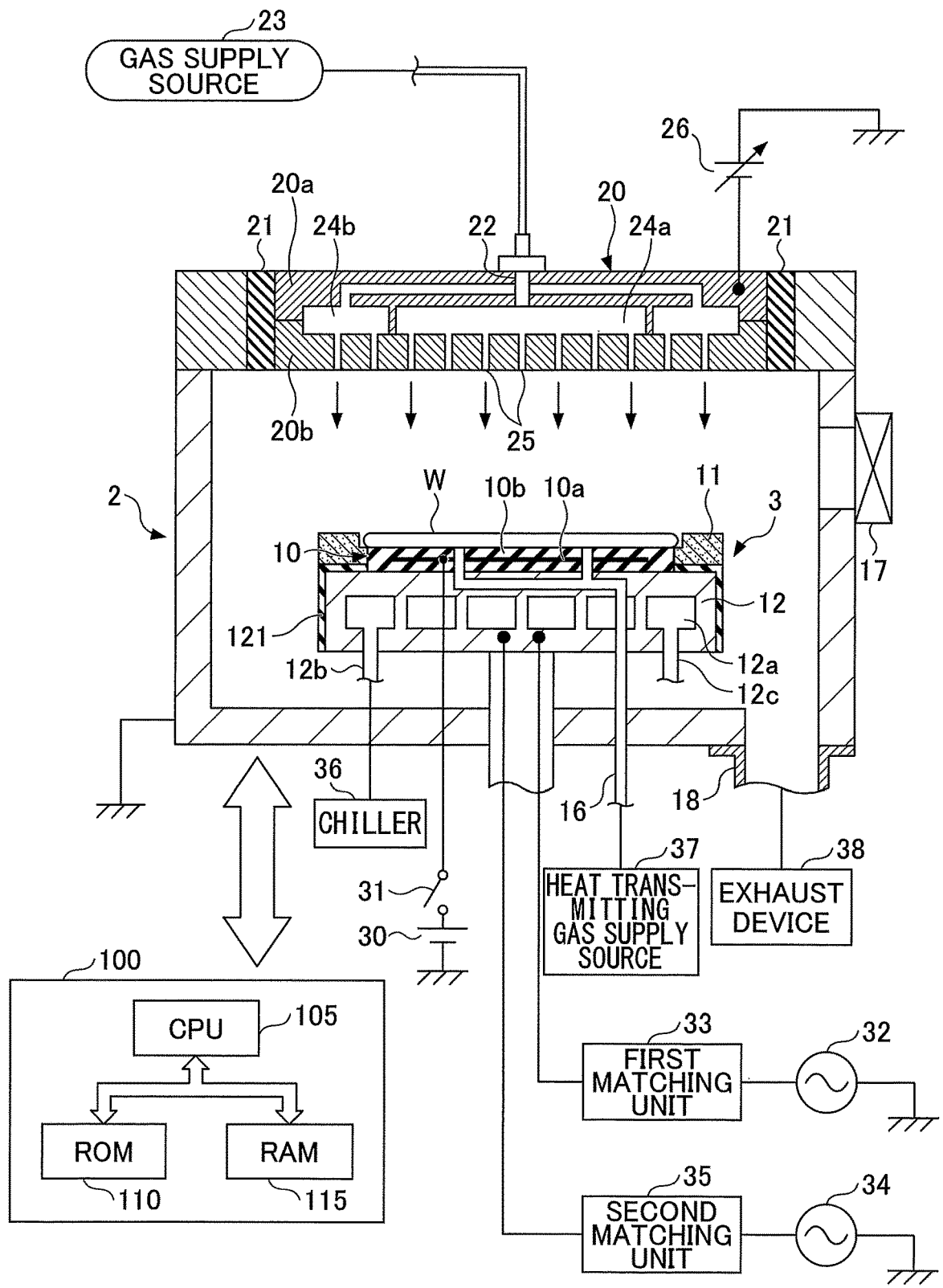
FIG. 1 is a view illustrating an example of a plasma processing apparatus according to a present embodiment.

First, an example of a plasma processing apparatus 1 will be described with reference to FIG. 1. The plasma processing apparatus 1 according to a present embodiment is a capacitively coupled plasma type parallel-flat plate plasma processing apparatus, and includes a substantially cylindrical processing vessel (chamber) 2. To an internal surface of the processing vessel 2, anodic oxidation treatment is applied. An inside of the processing vessel 2 is a processing chamber for performing plasma treatment such as etching or depositing.

A mounting base 3 is used for placing a semiconductor wafer (hereinafter, it will be referred to as a "wafer") which is an example of a substrate. The mounting base 3 includes a base member 12, and an electrostatic chuck (ESC) 10 disposed on the base member 12. The electrostatic chuck 10 is for attracting a wafer W electrostatically. The mounting base 3 is fixed at a bottom of the processing vessel 2. The base member 12 is formed of, for example, aluminum (Al), titanium (Ti), or silicon carbide (SiC). The mounting base 3 also acts as a lower electrode (bottom electrode).

The electrostatic chuck 10 is configured such that an electrode layer 10a is embedded in a dielectric layer 10b. A direct current power source (DC power source) 30 is connected to the electrode layer 10a. When a switch 31 is turned on, DC voltage is applied from the DC power source 30 to the electrode layer 10a and the wafer W is attracted to the electrostatic chuck 10 by the Coulomb force.

On the outer circumferential side of the electrostatic chuck 10, an annular focus ring 11 is disposed so as to surround an outer edge of the wafer W. The focus ring 11 is formed of silicon, for example, and improves efficiency of plasma treatment by making plasma converge on a surface of the wafer W in the processing vessel 2.

As illustrated in FIG. 2A or FIG. 2B, the electrostatic chuck 10 is adhered to the base member 12 via an adhesive layer 122. Referring back to FIG. 1, inside the base member 12, a coolant passage 12a is formed. Coolant such as water or brine that is output from a chiller 36 flows from a coolant inlet pipe 12b to a coolant outlet pipe 12c through the coolant passage 12a and circulates. By the circulating coolant, heat is released and the mounting base 3 is cooled.

A heat transmitting gas supply source 37 supplies heat transmitting gas such as He gas between an upper surface of the electrostatic chuck 10 and the lower surface of the wafer W, through a heat transmitting gas supply line 16. Accordingly, temperature of the electrostatic chuck 10 is controlled with the coolant circulating in the coolant passage 12a and the heat transmitting gas supplied to the lower surface of the wafer W. As a result, the wafer W is maintained in a predetermined temperature.

A first high frequency power source 32 is connected to the mounting base 3 via a first matching unit 33, and supplies high frequency electric power HF for generating plasma. Also, a second high frequency power source 34 is connected to the mounting base 3 via a second matching unit 35, and supplies high frequency electric power LF for generating bias voltage. The frequency of the high frequency electric power HF for generating plasma may be, for example, 40 MHz. The frequency of the high frequency electric power LF for generating bias voltage is less than the frequency of the high frequency electric power HF, and may be 13.56 MHz, for example. Though the high frequency electric power HF is applied to the mounting base 3 in the present embodiment, the high frequency electric power HF may be applied to a gas shower head 20.

The first matching unit 33 acts such that the internal impedance of the first high frequency power source 32 coincides with the apparent load impedance while plasma is generated in the processing vessel 2. The second matching unit 35 acts such that the internal impedance of the second high frequency power source 34 coincides with the apparent load impedance while plasma is generated in the processing vessel 2.

The gas shower head 20 includes a main unit 20a and a top plate 20b, and is disposed at a ceiling of the processing vessel 2. The gas shower head 20 is mounted to the processing vessel 2 through an insulating member 21. The main unit 20a consists of conductive material, such as aluminum whose surface is anodized, and is configured such that the top plate 20b is detachably attached at the bottom of the main unit 20a. The top plate 20b may be formed of silicon. The top plate 20b is adhered to the main unit 20a via an adhesive.

A variable DC power supply 26 is connected to the gas shower head 20, and applies a negative DC voltage to the gas shower head 20. The gas shower head 20 may be formed of silicon. The gas shower head 20 also acts as an opposing electrode (upper electrode) facing the mounting base 3 (lower electrode).

A gas inlet 22 for introducing gas is formed at the gas shower head 20. Inside the gas shower head 20, a gas diffusion chamber 24a located in a center of the gas shower head 20 and a gas diffusion chamber 24b located in the edge side of the gas shower head 20 are provided, and each of the gas diffusion chambers 24a and 24b is connected to the gas inlet 22. When gas is output from a gas supply source 23, the gas is supplied to the gas diffusion chambers 24a and 24b via the gas inlet 22 and diffuses in the gas diffusion chambers 24a and 24b. Then the gas is introduced from the large number of gas holes 25 to the mounting base 3.

At a bottom of the processing vessel 2, an exhaust port 18 is formed. Gas in the processing vessel 2 is discharged by an exhaust device 38 connected to the exhaust port 18. According to the structure of the processing vessel 2, the inside of the processing vessel 2 is maintained in a predetermined quality of vacuum. At a side wall of the processing vessel 2, a gate valve 17 is provided. Opening and closing of the gate valve 17 is performed when the wafer W is loaded into the processing vessel 2 or unloaded from the processing vessel 2.

A controller 100 for performing overall control of the plasma processing apparatus 1 is provided to the plasma processing apparatus 1. The controller 100 includes a CPU (Central Processing Unit) 105, a ROM (Read Only Memory) 110, and a RAM (Random Access Memory) 115. The CPU 105 executes a desired plasma treatment such as etching, in accordance with a recipe stored in a memory region such as the RAM 115. The recipe includes control information of the apparatus corresponding to a process condition, such as a time required for the process, a pressure (of exhaust gas), power or voltage of the high frequency power source, an amount of flow of each gas, a temperature inside the processing vessel (such as a temperature of the upper electrode, a temperature of an inner wall of the processing vessel, a temperature of the wafer W, and a temperature of the electrostatic chuck), and a temperature of coolant output from the chiller 36. The recipe and the program used by the controller 100 may be stored in a hard disk drive or a semiconductor memory. Alternatively, the recipe and the like may be stored in a removable storage medium such as a CD-ROM or a DVD, and the removable storage medium may be loaded in a predetermined place in an accessible state.

When plasma treatment, such as etching and depositing, is applied to the wafer W, opening and closing of the gate valve 17 is controlled, and the wafer W is loaded into the processing vessel 2 and placed on the mounting base 3. When a positive or negative DC voltage is applied from the DC power source 30 to the electrode layer 10a, the wafer W is attracted electrostatically and held to the electrostatic chuck 10.

When performing a process, a given gas is introduced into the processing vessel 2 from the gas supply source 23, and the high frequency power HF is applied to the mounting base 3 from the first high frequency power source 32. The high frequency power LF may be applied to the mounting base 3 from the second high frequency power source 34. A negative DC voltage may be applied to the gas shower head 20 by the variable DC power supply 26. As a result, gas is dissociated and plasma is generated above the wafer W. Further, by an effect of the plasma, plasma treatment is applied to the wafer W.

After plasma treatment, DC voltage having an opposite polarity to the polarity when the wafer W is attracted is applied from the DC power source 30 to the electrode layer 10*a*, to remove electrical charge of the wafer W. After removing the electrical charge, the wafer W is removed from the electrostatic chuck 10, and is unloaded from the gate valve 17 to an outside of the processing vessel 2.

[Manufacturing Electrostatic Chuck]

With reference to FIG. 2A and FIG. 2B, a specific structure of the electrostatic chuck 10 will be described. First, an example of a structure of the electrostatic chuck 10 according to the present embodiment which is illustrated in FIG. 2A will be described. The electrostatic chuck 10 is a sintered material of alumina ceramic ($Al_2O_3$), and is disposed on the base member 12. The base member 12 has a step on its circumference, and the annular focus ring 11 is disposed on the step. The base member 12 is formed of aluminum, and an outer side wall (including the step) of the base member 12 is coated with thermal sprayed ceramic 121 consisting of alumina ($Al_2O_3$). Note that yttria ($Y_2O_3$) may be used instead of alumina ($Al_2O_3$).

By the adhesive layer 122 provided on an upper surface of the base member 12, the electrostatic chuck 10 is adhered to the base member 12. An example of the adhesive layer 122 is a resin layer formed of silicone. The silicone may be polyimide resin, or may be other resins.

Thickness of the adhesive layer 122 according to the present embodiment (which corresponds to a gap width between the base member 12 and the electrostatic chuck 10) is approximately 100 μm to 300 μm. A part of the adhesive layer 122 which is exposed from a gap between the base member 12 and the electrostatic chuck 10 is coated with a thermal sprayed film 123, which is formed by thermal spraying of molten feedstock powder having a particle diameter of 15 μm or less. The thermal sprayed film 123, having a corresponding width of approximately 100 μm to 300 μm, is formed on the circumference of the adhesive layer 122, in a circumferential direction of the electrostatic chuck 10. Because the circumference of the adhesive layer 122 is coated with the thermal sprayed film 123, the circumference of the adhesive layer 122 is protected. A method of thermal spraying a narrow region of several hundred μm will be described below. Note that, in the present embodiment, in expressing dimensions of the thermal sprayed film 123 or a thermal sprayed film 124 to be described below, a dimension of a direction to which the thermal sprayed film 123 (or 124) is deposited (which is a lateral direction in FIG. 2A or FIG. 2B) is referred to as a "thickness", and a dimension of a direction orthogonal to the thickness direction and a circumferential direction of the electrostatic chuck 10 (which is a vertical direction in FIG. 2A or FIG. 2B) is referred to as a "width".

In a case in which a width of a gap between the base member 12 and the electrostatic chuck 10 at an outside of the adhesive layer 122 is approximately 100 μm to 1000 μm, a thermal sprayed film 124 having a width of approximately 100 μm to 1000 μm may be formed by thermal spraying, such that the thermal sprayed film 124 connects the base member 12 (thermal sprayed ceramic 121) with the electrostatic chuck 10 (dielectric layer 10*b*), as illustrated in FIG. 2B. In this case, the thermal sprayed film 124 having a width of approximately 100 μm to 1000 μm is formed in the circumferential direction, to protect the circumference of the adhesive layer 122. In the following, examples of the thermal sprayed film 123 will be mainly described. However, the following description is also applied to the thermal sprayed film 124.

Feedstock for thermal spraying which is used for connecting the thermal sprayed ceramic 121 with the dielectric layer 10*b* may be of the same type of ceramic, or may be of different types of ceramics.

Thickness of the thermal sprayed film 123 or 124 is 5 μm to 20 μm (note that the thickness of the thermal sprayed film 123 or 124 is in a direction orthogonal to the thickness of the adhesive layer 122). Although the feedstock (that is, the thermal sprayed film 123 and 124) may be inorganic metal material including metal oxide or metal nitride, the feedstock is preferably metal oxide such as alumina ($Al_2O_3$) or yttria ($Y_2O_3$).

Because silicone in the adhesive layer 122 is resin and contains organic matter, the adhesive layer 122 does not have high plasma resistance. Accordingly, if the adhesive layer 122 is exposed to plasma, the adhesive layer 122 will selectively be worn down and the adhesive layer 122 will be a dominant factor influencing a life of the electrostatic chuck 10. If, for example, the adhesive layer 122 were coated with material including a binder component in which granular ceramics are mixed with an organic solvent, the coating would not be able to prevent the adhesive layer 122 from being worn out because an organic solvent does not have high plasma resistance.

In the present embodiment, the thermal sprayed film 123 of alumina ceramic is formed, by thermal spraying, on a surface of the adhesive layer 122 exposed to plasma (side surface of the adhesive layer 122). In the present embodiment, because the thermal sprayed film 123 is formed by turning alumina ceramic powder into liquid and by thermal spraying the liquid, no organic solvent is contained. Accordingly, in the present embodiment, the adhesive layer 122 can be coated with inorganic material having high plasma resistance. As described above, according to the present embodiment, since the adhesive layer 122 is coated with an alumina ceramic film which is inorganic material and which does not contain a binder component, abrasion of the adhesive layer 122 can be mitigated and a life of the electrostatic chuck 10 can be prolonged.

[Plasma Spraying Apparatus]

A corresponding width of the exposed part of the adhesive layer 122 is approximately 100 μm to 300 μm. To deposit the thermal sprayed film 123 on such a narrow region, a plasma spraying apparatus 150 capable of thermal spraying a region of the order of $10^2$ μm width is used. In the following, an example of a structure of the plasma spraying apparatus 150 will be described with reference to FIG. 3, FIG. 4A, and FIG. 4B.

Figure 3:
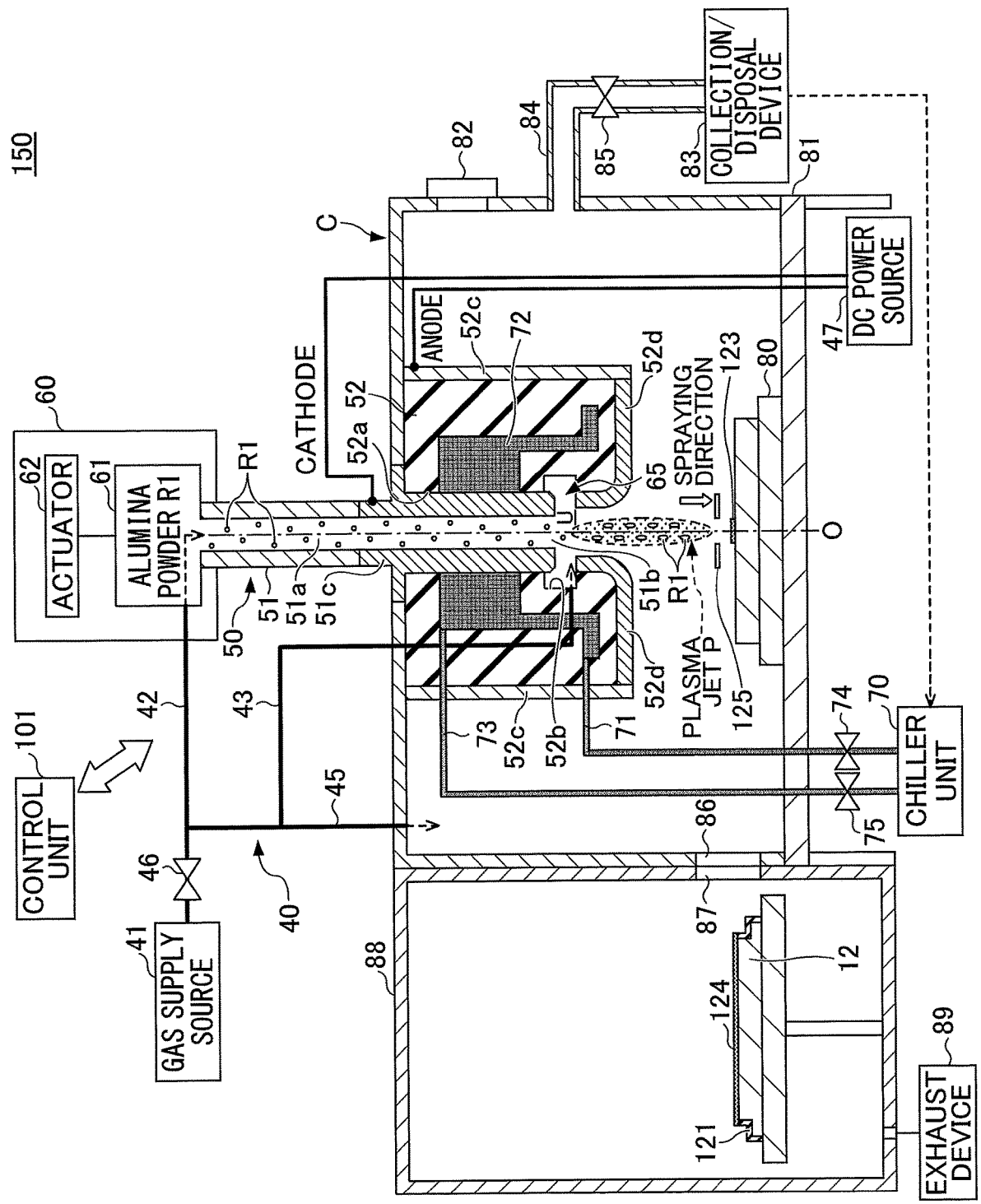
FIG. 3 is a view illustrating an example of a plasma spraying apparatus according to a present embodiment.

As illustrated in FIG. 3, the plasma spraying apparatus 150 injects feedstock powder from a tip (opening 51*b*) of a nozzle 51. The feedstock is molten by heat of plasma jet P formed from high-speed gas, and sprayed onto the base member 12. As a result, the thermal sprayed film 123 is formed on the base member 12.

In the present embodiment, fine powder of alumina having a particle diameter of 15 μm or less (hereinafter referred to as "alumina powder R1") is used as an example of feedstock powder. However, the feedstock powder may be any inorganic metal materials, as long as the material contains metal oxide or metal nitride, such as the above mentioned ceramic or composite material in which metal is added to ceramic, and a particle diameter of the material is 15 μm or less.

Because the plasma spraying apparatus 150 according to the present embodiment melts feedstock with low energy, the feedstock powder does not sublime and can be thermal sprayed on a region of a width of 10 μm to 300 μm. That is, even if feedstock has a low melting temperature, thermal spraying of the feedstock can be performed in the plasma spraying apparatus 150 according to the present embodiment.

The plasma spraying apparatus 150 includes a supplying unit 50, a control unit 101, a gas supplying unit 40, a plasma generating unit 65, a chamber C, a collection/disposal device 83, and a drying room 88. The supplying unit 50 includes a nozzle 51 and a feeder 60. The alumina powder R1 is stored in a container 61 in the feeder 60. The alumina powder R1 is fine powder of alumina having a particle diameter of 15 μm or less. The feeder 60 supplies the alumina powder R1 to the nozzle 51. By plasma generating gas, the alumina powder R1 is conveyed to the tip of the nozzle 51 through the nozzle 51, and is injected from the opening 51b with the plasma generating gas.

The feeder 60 includes an actuator 62. The nozzle 51 is a straight tubular member, and a passage 51a for conveying the alumina powder R1 is formed inside the nozzle 51. The passage 51a in the nozzle 51 is connected to an inside of the container 61. As the container 61 is vibrated by the actuator 62, the alumina powder R1 enters from the container 61 to the passage 51a of the nozzle 51.

In addition to the alumina powder R1, the plasma generating gas is supplied to the nozzle 51. The plasma generating gas is a source gas for generating plasma. The plasma generating gas also acts as a carrier gas for conveying the alumina powder R1 through the passage 51a. The plasma generating gas is supplied from a gas supply source 41, and is conveyed to the passage 51a of the nozzle 51 through a pipe 42. The gas supplying unit 40 controls a flow of the plasma generating gas using a valve 46 and a mass flow controller (MFC: not shown). Ar gas, He gas, $N_2$ gas, $H_2$ gas, or combinations of these gases may be used as the plasma generating gas. In the present embodiment, a case in which Ar gas is supplied as the plasma generating gas will be described.

The nozzle 51 runs through a main unit 52, and the tip of the nozzle 51 protrudes inside a plasma generating space U. The alumina powder R1 is conveyed to the tip of the nozzle 51 by plasma generating gas, and is injected, with the plasma generating gas, into the plasma generating space U from the opening 51b of the tip.

The nozzle 51 is formed of metal. The main unit 52 is formed of insulating material. A through hole 52a is provided at a central axis of the main unit 52, and a first half 51c of the nozzle 51 is inserted into the main unit 52 through the through hole 52a. As a DC power source 47 is connected to the first half 51c of the nozzle 51, the first half 51c of the nozzle 51 also acts as an electrode (cathode) for supplying current from the DC power source 47.

The plasma generating space U is a space mainly formed of a concavity 52b and a projecting part 52d of the main unit 52. The tip of the nozzle 51 protrudes inside the plasma generating space U. The projecting part 52d is connected at one end to a metal plate 52c provided on an outer side surface. As the DC power source 47 is connected to the metal plate 52c, the metal plate 52c and the projecting part 52d act as an electrode (anode).

As electrical power of 50 kW or less for example is supplied between the electrodes, discharge occurs between the tip of the nozzle 51 and the projecting part 52d. Accordingly, the plasma generating unit 65 generates argon plasma from Ar gas injected from the nozzle 51 in the plasma generating space U.

Also, Ar gas supplied in the plasma generating space U generates a rotational flow. Specifically, the Ar gas is supplied from the gas supply source 41 under control of the valve 46 and the mass flow controller, and is supplied to the plasma generating space U through a pipe 43 and within the main unit 52. The Ar gas enters the plasma generating space U in a lateral direction.

Multiple gas supply paths for introducing Ar gas are provided in the main unit 52. Accordingly, Ar gas is supplied into the plasma generating space U from the multiple gas supply paths, and the Ar gas supplied from the multiple gas supply paths generates a rotational flow in the plasma generating space U. Because of the rotational flow, diffusion of plasma generated in the plasma generating unit 65 is prevented, and the plasma jet P is linearly emitted. In the plasma generating unit 65, the plasma generating gas injected from the tip of the nozzle 51 is changed into plasma, and the plasma jet P is generated. The plasma jet P generated here has a common axis O with the nozzle 51. "Having a common axis" in the present embodiment means that a central axis of the supplying unit 50 (nozzle 51) coincides with a central axis of a spraying direction of the plasma jet P.

According to the configuration of the plasma spraying apparatus 150, the alumina powder R1 is molten by heat of the plasma jet P formed by high-speed Ar gas. Also, as the molten alumina is sprayed onto a surface of the base member 12, thermal spraying is realized. Accordingly, the thermal sprayed film 123 is formed on the base member 12.

In the main unit 52, a coolant passage 72 is formed. Coolant that is output from a chiller unit 70 circulates in a coolant pipe 71, the coolant passage 72, and a coolant pipe 73 in accordance with a control of valves 74 and 75, and returns to the chiller unit 70. The coolant cools the main unit 52 and prevents the main unit 52 from being overheated. At a side wall of the chamber C, a window 82 for observing an inside of the chamber C is provided.

[Nozzle Structure]

Figure 4A:
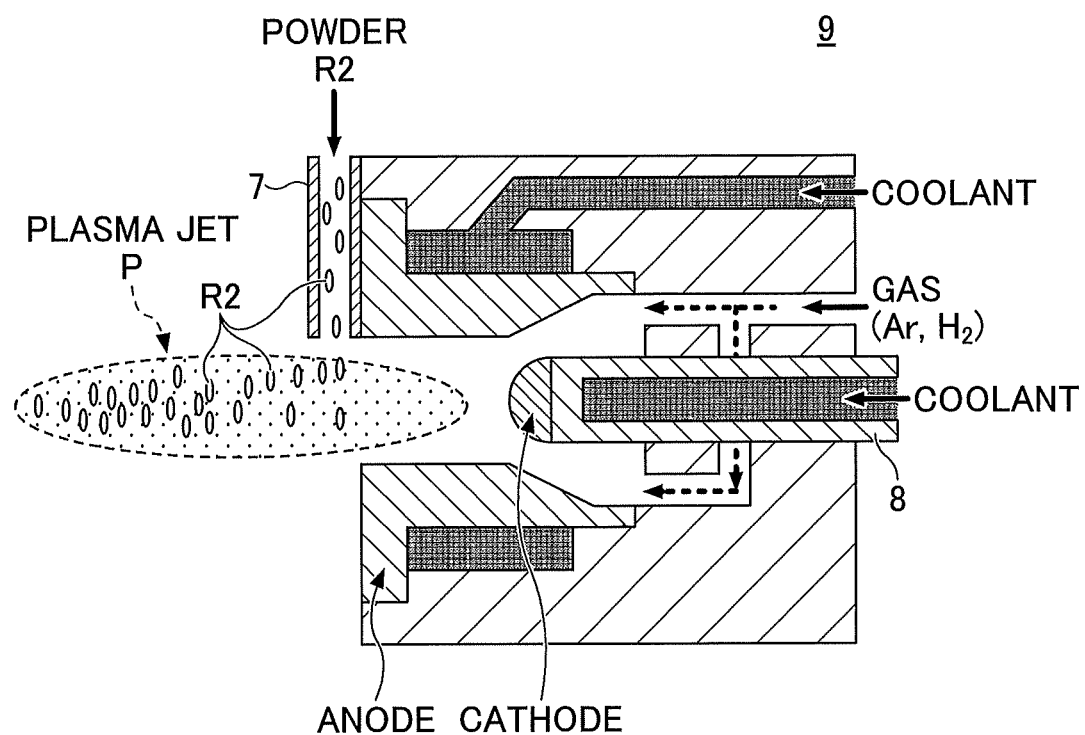
FIG. 4A is a diagram illustrating a plasma jet generated by a plasma spraying apparatus according to a comparative example.
Figure 4B:
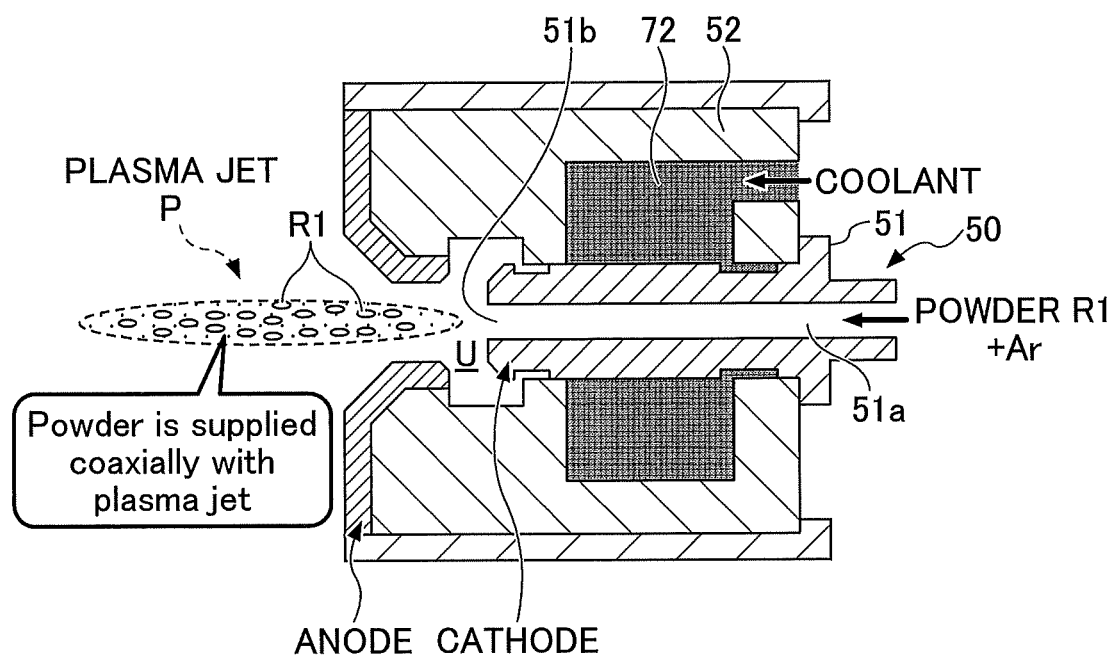
FIG. 4B is a diagram illustrating a plasma jet generated by the plasma spraying apparatus according to the present embodiment.

In the plasma spraying apparatus 150 according to the present embodiment, as illustrated in FIG. 4B, the nozzle 51 of the supplying unit 50 is configured to have a common axis with the plasma jet P. According to the configuration, the spraying direction of the alumina powder R1 can be configured to coincide with a direction of the plasma jet P. That is, the alumina powder R1 is supplied coaxially with the plasma jet P. As a result, high directivity of thermal spraying is realized, and the alumina ceramic thermal sprayed film 123 of the order of $10^2$ μm width can be formed, through a mask, on the adhesive layer 122 exposed between the base member 12 and the electrostatic chuck 10. The thermal sprayed film 123 is thin film having a thickness of 5 μm to 20 μm.

On the other hand, in the plasma spraying apparatus 9 according to a comparative example, as illustrated in FIG. 4A, feedstock powder R2 is supplied to plasma jet P via a supplying tube 7 disposed in a direction perpendicular to a direction of a plasma jet P formed ahead of a nozzle 8. That is, the feedstock powder R2 enters the plasma jet P in a perpendicular direction. If a particle diameter of the feedstock powder R2 is small, the feedstock powder R2 will be repelled at a boundary layer of the plasma jet P and cannot enter the plasma. Therefore, in the plasma spraying apparatus 9 according to the comparative example, feedstock powder having a particle diameter of 30 μm to 100 μm needs be used, as illustrated in a table of FIG. 4A. In the plasma spraying apparatus 150 according to the present embodiment, as the nozzle 51 of the supplying unit 50 is configured to have a common axis with the plasma jet P, even if a particle diameter of feedstock powder is not large, the feedstock powder will not be repelled at a boundary layer of the plasma jet P. Accordingly, in the present embodiment, a particle diameter of feedstock powder R1 to be used may be 15 μm or less, as illustrated in a table of FIG. 4B. As can be seen from the above description, the feedstock powder R2 to be used in the comparative example needs to be larger than the feedstock powder R1 to be used in the present embodiment. Specifically, a particle diameter of the powder R2 is approximately ten times larger than that of the powder R1, and volume of the powder R2 is approximately a thousand times larger than that of the powder R1.

As described above, in the plasma spraying apparatus 150 according to the present embodiment, the feedstock powder R1 can be liquefied by low electric power of not more than 50 kW that is output from DC power source. Conversely, in the plasma spraying apparatus 9 according to a comparative example, electric power supplied from a DC power source that is necessary to melt the feedstock powder R2 by plasma must be not less than twice the electric power required by the plasma spraying apparatus 150 according to the present embodiment. As a result, in the plasma spraying apparatus 9 according to the comparative example, the base member 12 or the adhesive layer 122 will burn during thermal spraying. For example, as silicone contained in the adhesive layer 122 will be carbonized, the thermal sprayed film 123 cannot be formed.

On the other hand, when using the plasma spraying apparatus 150 according to the present embodiment, because the feedstock powder R1 can be small and a feed amount of the feedstock powder R1 per unit of time can be approximately one tenth of that of the comparative example, electric power required for melting feedstock powder may be small. Accordingly, the base member 12 or the adhesive layer 122 will not burn during thermal spraying, and the thermal sprayed film 123 of alumina ceramic, for example, can be formed on silicone of the adhesive layer 122. Also, in the plasma spraying apparatus 150 according to the present embodiment, because the feed amount of the feedstock powder R1 per unit of time can be approximately one tenth of that of the comparative example, thickness of the thermal sprayed film 123 to be formed can be finely controlled.

Further, in the plasma spraying apparatus 150 according to the present embodiment, as the nozzle 51 of the supplying unit 50 is configured to have a common axis with the plasma jet P, the spraying direction of the alumina powder R1 is the same as a direction of the plasma jet P. Accordingly, high directivity of thermal spraying is realized, and the alumina ceramic thermal sprayed film 123 can selectively be formed, through a mask 125, on a narrow region of the side surface of the base member 12 where the adhesive layer 122 is exposed, with an accuracy of several micrometers.

Referring back to FIG. 3, the chamber C in the plasma spraying apparatus 150 will be described. The chamber C is a cylindrical hollow container, and is formed of aluminum, stainless steel, or quartz, for example. The chamber C supports the main unit 52 at a ceiling of the chamber C, and makes the supplying unit 50 and the plasma generating unit 65 enclosed regions. The base member 12 is placed on a stage 80 provided at a bottom 81 of the chamber C. In the present embodiment, an inside of the chamber C is decompressed to a predetermined pressure. However, the inside of the chamber C is not necessarily decompressed, and a process may be performed under an atmospheric pressure.

The inside of the chamber C is filled with Ar gas. The Ar gas is supplied to the chamber C from the gas supply source 41 through a pipe 45. However, types of gas, with which the inside of the chamber C is filled, are not limited to Ar gas, and any types of inert gas can be used.

The collection/disposal device 83 disposes the alumina powder, by sucking in the Ar gas and the alumina powder from the inside of the chamber C through an exhaust pipe 84, in accordance with opening of a valve 85.

The drying room 88 is adjacent to the chamber C, and forms an enclosed region dehumidified to a predetermined humidity. The drying room 88 is also decompressed to a predetermined pressure by an exhaust device 89. However, the drying room 88 is not necessarily decompressed. The base member 12 to which thermal spraying of ceramic is applied is conveyed to the drying room 88 via gate valves 86 and 87, and is transferred to the next process.

The plasma spraying apparatus 150 includes a control unit 101 for controlling the plasma spraying apparatus 150. The control unit 101 controls the gas supply source 41, the feeder 60 (actuator 62), the DC power source 47, the chiller unit 70, the collection/disposal device 83, and the like.

The control unit 101 selects a recipe or a program for plasma spraying of a specific feedstock, and controls each element of the plasma spraying apparatus 150. By the control unit 101, a process of thermal spraying the thermal sprayed film 123 through the mask 125 to the side surface of the adhesive layer 122 is executed.

[Experimental Result of Forming Thermal Sprayed Film]

In the following, experimental results regarding the thermal sprayed film 123 of alumina ceramic, which was formed by the plasma spraying apparatus 150, will be described with reference to FIGS. 5A to 9C.

(Quality and Adhesion of Film)

Figure 5A:
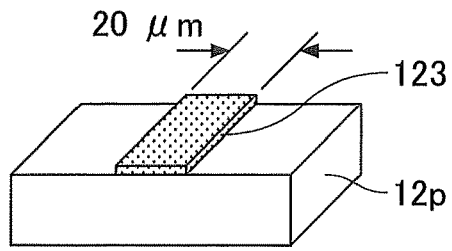
FIGS. 5A and 5B are diagrams illustrating an example of an experimental result regarding quality and adhesion of thermal sprayed film according to the present embodiment.
Figure 5B:
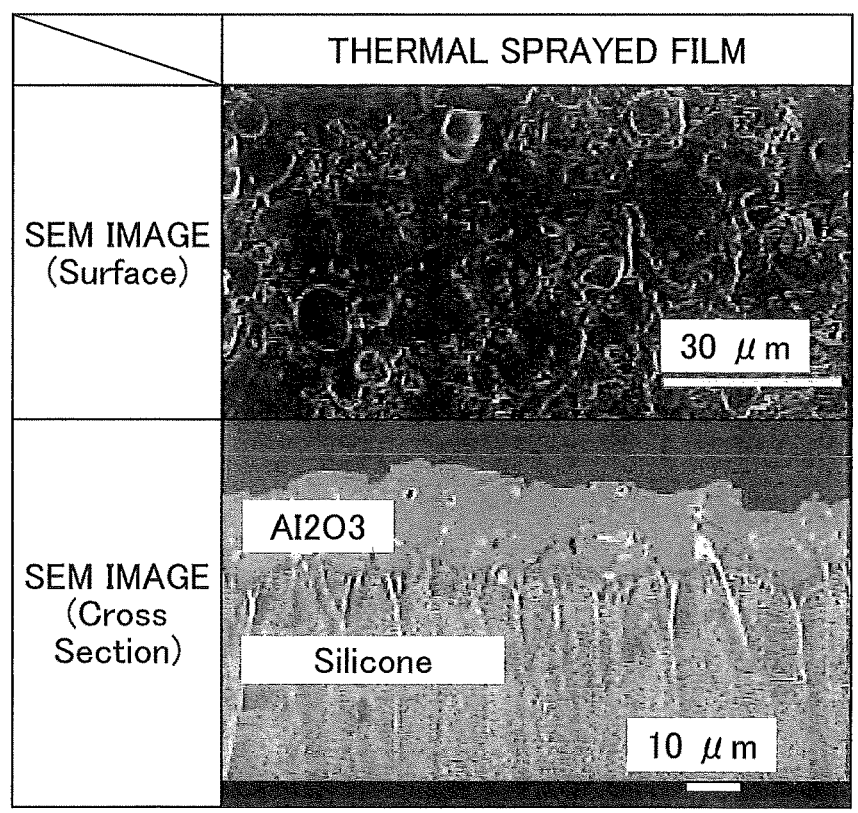

First, an example of an experimental result regarding quality and adhesion of the thermal sprayed film 123 according to the present embodiment will be described with reference to FIGS. 5A and 5B. In this experiment, by using the plasma spraying apparatus 150, the thermal sprayed film 123 having 20 μm width was deposited on a silicone piece 12p, as illustrated in FIG. 5A. Images of the deposited thermal sprayed film 123 are illustrated in FIG. 5B. The upper image in FIG. 5B is a SEM image of a surface of the deposited thermal sprayed film 123, and the lower image in FIG. 5B is a SEM image of a cross section of the deposited thermal sprayed film 123. As can be seen from the images in FIG. 5B, fine alumina ceramic thermal sprayed film 123 is formed, by molten alumina feedstock powder having a particle diameter of 15 μm or less. Further, as can be seen from the lower image in FIG. 5B, the alumina ceramic thermal sprayed film 123 adheres firmly to a substrate (the silicone piece 12p). That is, it was found that, by using a plasma spraying method according to the present embodiment, a thermal sprayed film 123 having high quality and high adhesion to a substrate can be formed.

(Corrosion Resistance)

Figure 6:
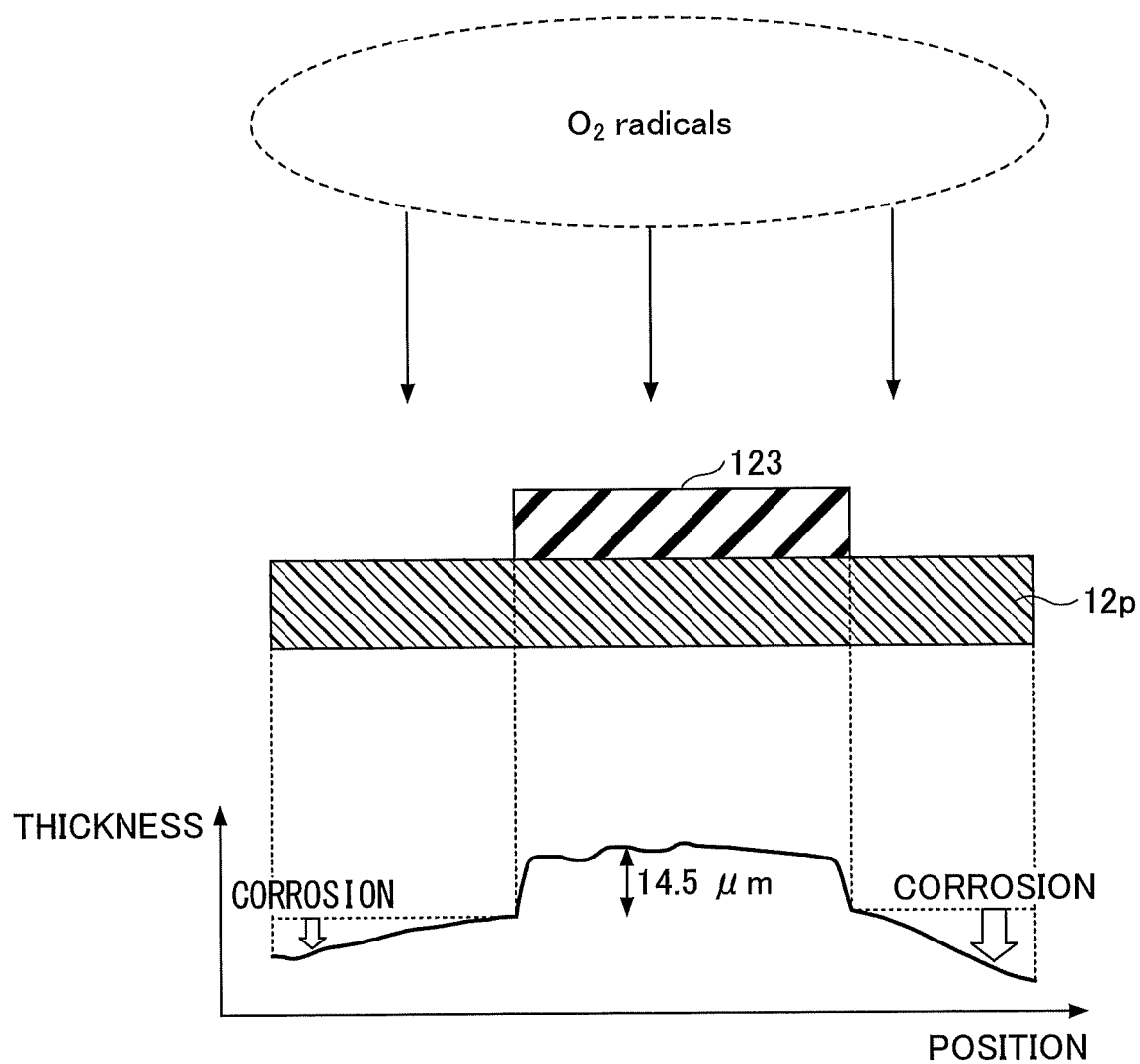
FIG. 6 is a diagram illustrating an example of an experimental result regarding corrosion of the thermal sprayed film according to the present embodiment.

Next, an example of an experimental result regarding corrosion of the thermal sprayed film 123 according to the present embodiment will be described with reference to FIG. 6. In this experiment, after the thermal sprayed film 123 having 20 μm width was deposited on a silicone piece 12p, the silicone piece 12p was placed on the mounting base 3 in the plasma processing apparatus 1 illustrated in FIG. 1, and a process for generating $O_2$ plasma in the plasma processing apparatus 1 was performed. As a result of this experiment, part of the silicone piece 12p which was not coated with the thermal sprayed film 123 and was exposed to plasma was worn down, mainly because of $O_2$ radicals in the $O_2$ plasma. On the other hand, the other part of the silicone piece 12p, which is coated with the thermal sprayed film 123 (which corresponds to a portion having a thickness of 14.5 μm illustrated in FIG. 6), was not worn down. According to the above result, it was found that the thermal sprayed film 123 according to the present embodiment can prevent the adhesive layer 122 from being worn down, by covering a surface of the adhesive layer 122 exposed to plasma.

(Pattern Width)

Figure 7A:
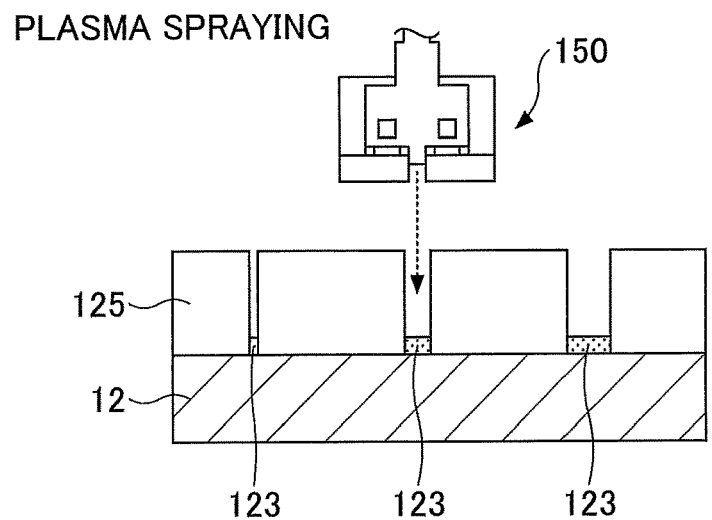
FIGS. 7A and 7B are diagrams illustrating an example of an experimental result regarding pattern widths of the thermal sprayed film according to the present embodiment.
Figure 7B:
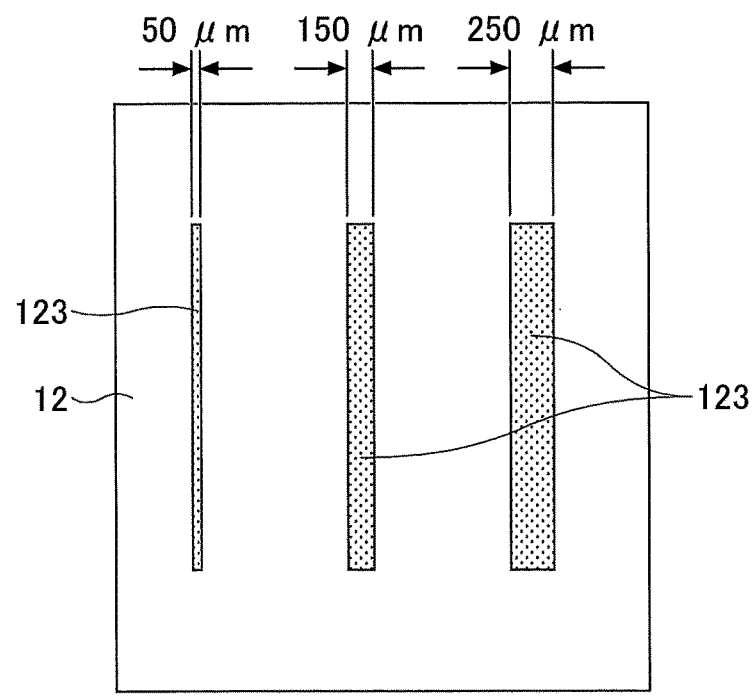

Next, an example of an experimental result regarding pattern widths of the thermal sprayed film 123 according to the present embodiment will be described with reference to FIGS. 7A and 7B. In this experiment, as illustrated in FIG. 7A, molten feedstock injected from the plasma spraying apparatus 150 was sprayed to the base member 12 through the mask 125, in accordance with patterns of slits (openings) formed on the mask 125.

A slit pattern of 50 μm width, a slit pattern of 150 μm width, and a slit pattern of 250 μm width were formed on the mask 125. As a result of plasma spraying according to the present embodiment, three pieces of the thermal sprayed film 123, having 50 μm width, 150 μm width, and 250 μm width, were formed on the silicone piece 12p, as illustrated in FIG. 7B. Accordingly, it was found that, in the present embodiment, through the mask having a slit of a narrow width such as several tens of micrometers or several hundred micrometers, a thermal sprayed film 123 having a narrow width, such as 50 μm, 150 μm, and 250 μm, can be formed.

(Types of Adhesive Layers)

Next, types of the adhesive layers 122 according to the present embodiment will be described with reference to FIG. 8. A result of an experiment of thermal spraying, in which thermal spraying was applied to different types of adhesives, is illustrated in FIG. 8. The left column in FIG. 8 represents types of the adhesive layers 122 on which thermal spraying is applied, and the right column represents whether or not the thermal spraying was successful (circle mark means that the thermal spraying was successful). In the experiment, thermal spraying has been performed through a mask 125 having a slit of 150 μm width. It was confirmed that the thermal sprayed film 123 corresponding to a width of the slit can be deposited on any adhesive layers 122 from the group of silicone resin, acrylic resin, and epoxy resin.

(Thermal Spraying Method Through Mask)

Next, a method of thermal spraying through a mask 125 will be described with reference to FIGS. 9A to 9C. A resin mask made of such as acrylic resin, epoxy resin, or silicone resin like polyimide, a resin fiber mask, or a metal mask can be used as the mask 125 in the present embodiment.

Figure 9A:
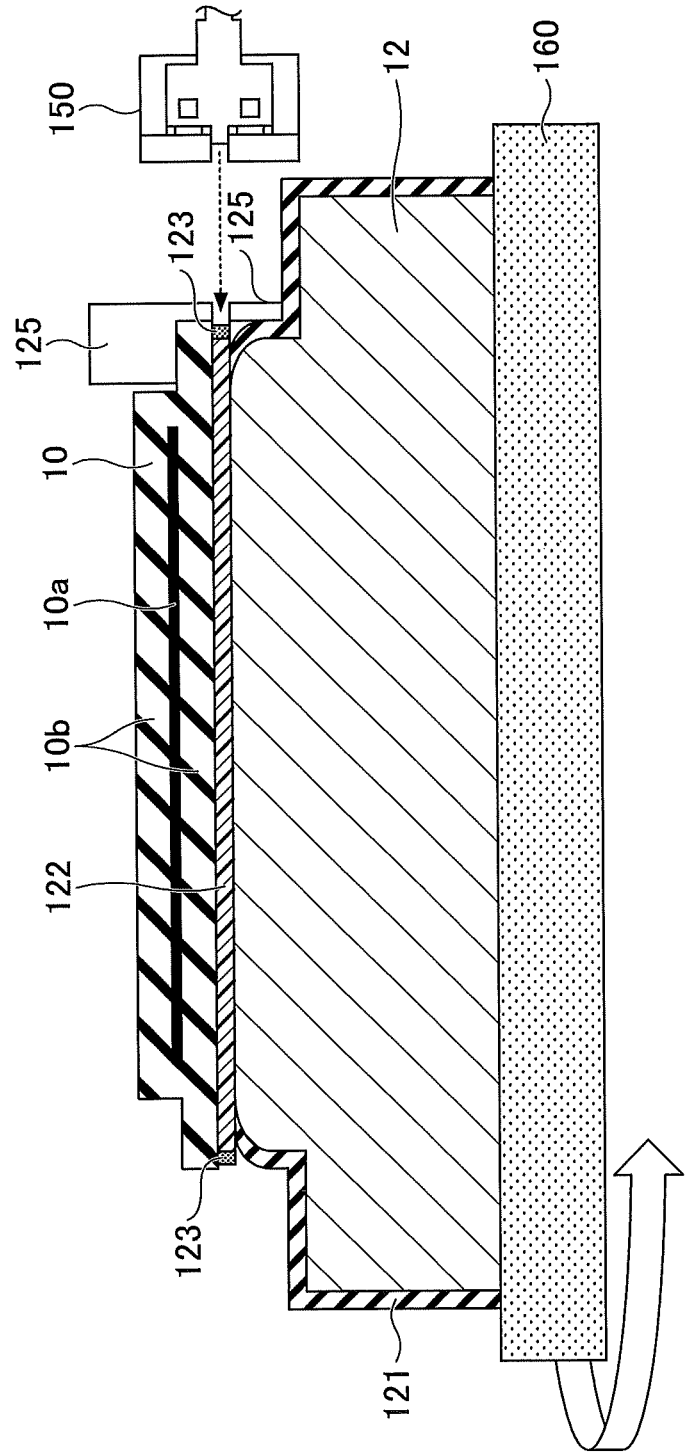
FIGS. 9A to 9C are diagrams illustrating a thermal spraying method through a mask according to the present embodiment.

The mask 125 according to the present embodiment is disposed, as illustrated in FIG. 9A for example, such that an opening of the mask 125 is positioned at the side surface of the adhesive layer 122 between the electrostatic chuck 10 and the base member 12. In an example illustrated in FIG. 9A, the mask 125 is not provided throughout a whole circumference of the side surface of the adhesive layer 122, but is disposed at a part of the side surface of the adhesive layer 122. However, the mask 125 according to the present embodiment may be provided throughout a whole circumference of the side surface of the adhesive layer 122, as illustrated in FIG. 9B. The mask 125 to be used in this case may be, for example, a mask covering an electrostatic chuck 10 on which a 300 mm wafer can be placed, and the mask 125 may be configured such that the mask 125 covers an upper surface and the side surface of the electrostatic chuck 10 in a disposed state, and such that an opening of the mask 125 is positioned at the side surface of the adhesive layer 122 between the electrostatic chuck 10 and the base member 12.

The base member 12 and the electrostatic chuck 10 are placed on a turn table 160. Thermal spraying is performed as in the following: while rotating the turn table 160, molten alumina feedstock emitted by the plasma spraying apparatus 150 is sprayed, via an opening of the mask 125, to a region of the side surface of the adhesive layer 122 having a width of 100 μm to 300 μm or having a width of 100 μm to 1000 μm.

Figure 9B:
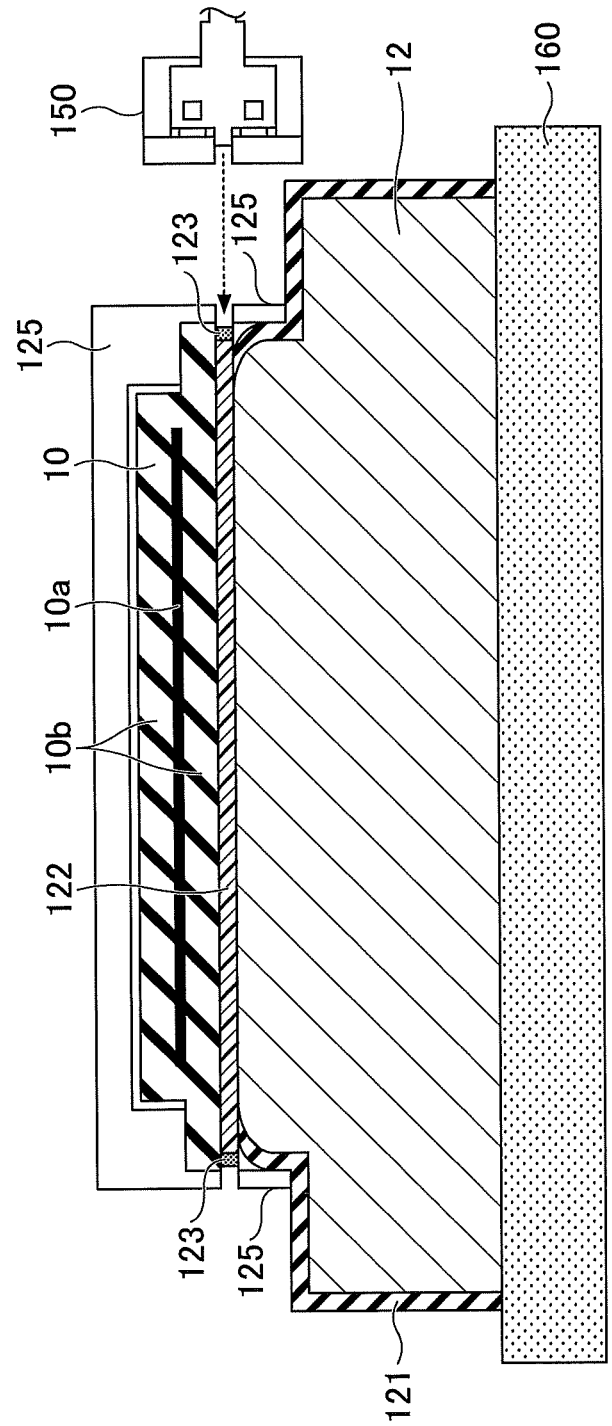

The mask 125 may be a physical mask such as a resin mask or a metal mask, as illustrated in FIG. 9A or FIG. 9B. A metal mask can be used multiple times for thermal spraying of a component for a plasma processing apparatus. Conversely, a resin mask can be used only once for thermal spraying of a component for a plasma processing apparatus.

In a case in which the mask 125 is disposed at a part of the side surface of the adhesive layer 122, as illustrated in FIG. 9A, by rotating the turn table 160 without rotating the mask 125, the thermal sprayed film 123 can be deposited on the side surface of the adhesive layer 122.

On the other hand, in a case in which the mask 125 is provided throughout a whole circumference of the side surface of the adhesive layer 122 of the electrostatic chuck 10, as illustrated in FIG. 9B, the mask 125 may be rotated together with the turn table 160, although the mask 125 is not necessarily rotated. By rotating the turn table 160, the thermal sprayed film 123 can be deposited on the side surface of the adhesive layer 122.

Figure 9C:
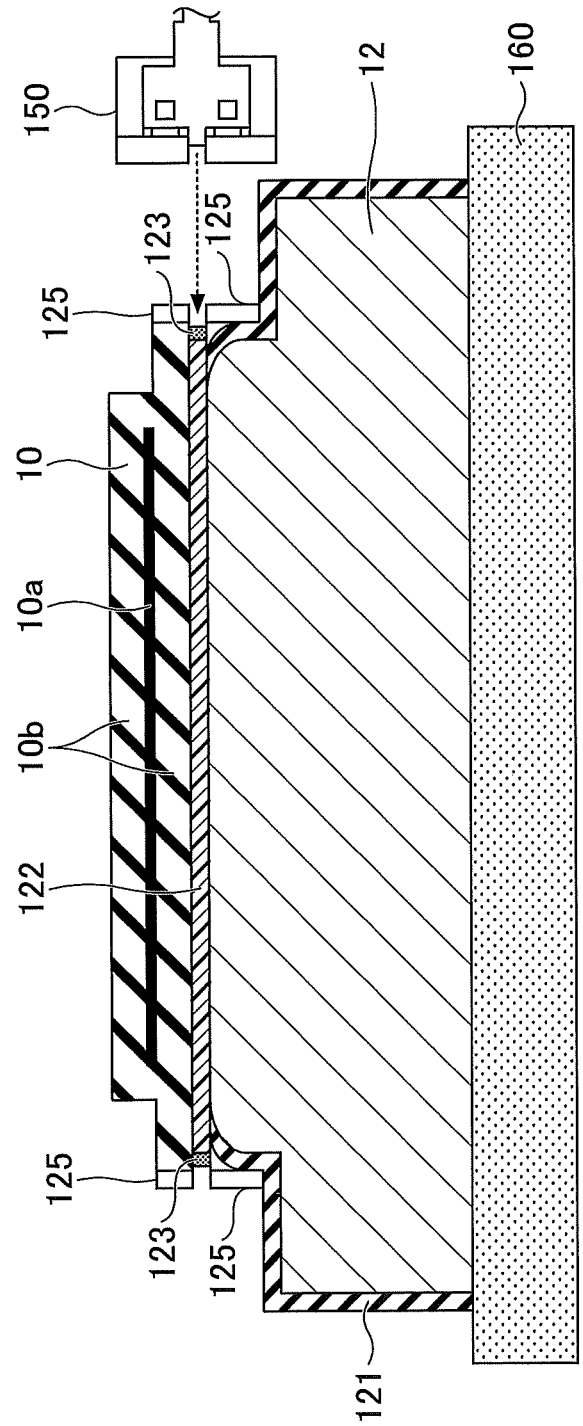

Further, as illustrated in FIG. 9C, the mask 125 may be a coating mask with which side surfaces of the base member 12 and the electrostatic chuck 10 are coated. The coating mask coats a whole circumference of the side surfaces of the base member 12 and the electrostatic chuck 10 such that an opening is formed at the side surface of the adhesive layer 122.

In a method of using a coating mask, the side surfaces of the base member 12 and the electrostatic chuck 10, except the side surface of the adhesive layer 122, are coated with coating agent made from water soluble resin. After the coating, plasma spraying by the plasma spraying apparatus 150 is performed. By the plasma spraying, the thermal sprayed film 123 can be deposited on the side surface of the adhesive layer 122. After the thermal spraying, the coating agent is removed by performing cleaning using water or the like.

As described above, according to the thermal spraying method in the present embodiment, a surface of an adhesive agent exposed from a narrow gap between two components can be coated with material having high plasma resistance.

In the above embodiment, a thermal spraying method of a component for a plasma processing apparatus and the component of the plasma processing apparatus have been described. However, the component of the plasma processing apparatus and thermal spraying method of the component according to the present invention are not limited to the above embodiment. Various changes or enhancements can be made hereto within the scope of the present invention. Matters described in the above embodiments may be combined unless inconsistency occurs.

In the above embodiment, thermal spraying is applied to a surface of an adhesive agent exposed from a narrow gap between the electrostatic chuck 10 of the mounting base 3 and the base member 12 of the mounting base 3, to form a thermal sprayed film having a width of 100 μm to 1000 μm. However, the mounting base 3 is merely an example of a component for a plasma processing apparatus, and a thermal spraying method according to the present invention can be applied to not only the mounting base 3 (lower electrode) but also to other components for a plasma processing apparatus.

For example, the thermal spraying method according to the present invention can be used in a case in which thermal sprayed film is formed on a side surface of an adhesive layer between the main unit 20a and the top plate 20b of the gas shower head 20 (upper electrode). Components for a plasma processing apparatus whose surface is coated by using the thermal spraying method according to the present invention are not limited to the mounting base or the gas shower head. The thermal spraying method according to the present invention can be applied to any component for a plasma processing apparatus including two members adhering to each other via an adhesive layer which is partly exposed to plasma.

The plasma processing apparatus according to the present invention can be applicable to any type of plasma processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, the semiconductor wafer W is referred to as an example of a substrate. However, the substrate processed by the plasma processing apparatus is not limited to the semiconductor wafer W. Examples of the substrate may include various types of substrates used in an LCD (Liquid Crystal Display) or a FPD (Flat Panel Display), a photomask, a CD substrate, and a printed circuit board.

What is claimed is:

1. A method of thermal spraying a component for a plasma processing apparatus performed by a plasma spraying apparatus including a nozzle and a plasma generating unit having a common axis with the nozzle, the plasma generating unit including a plurality of gas supply paths configured to supply, into the plasma generating unit, Ar gas in a direction perpendicular to the nozzle, in order to generate a rotational flow in the plasma generating unit, the method comprising:
    injecting, with a plasma generating gas, feedstock powder having a particle diameter of 15 μm or less from a tip of the nozzle to the plasma generating unit;
    supplying Ar gas from the plurality of gas supply paths into the plasma generating unit to generate the rotational flow in the plasma generating unit;
    generating a plasma from the plasma generating gas in the plasma generating unit, by using electric power not more than 50 kW; and
    thermal spraying the feedstock powder liquefied by the plasma at a concave portion defined by the component, an electrostatic chuck and a resin layer provided between the component and the electrostatic chuck through a mask, such that a surface of the resin layer that is exposed to the concave portion between the component and the electrostatic chuck is in close contact with the feedstock powder, wherein
        the resin layer of the component is exposed on a side surface of the component,
        the component is placed on a turn table such that the side surface of the component faces outward in a radial direction of the turn table, and
        the liquefied feedstock powder is sprayed toward the component on the turn table in a direction perpendicular to a central axis of the turn table while rotating the turn table, thereby to cover the resin layer exposed on the side surface of the component with the feedstock powder in a circumferential direction of the component.

2. The thermal spraying method according to claim 1, wherein, in the thermal spraying, the liquefied feedstock powder is deposited at a width of 100 μm to 1000 μm.

3. The thermal spraying method according to claim 1, wherein, in the thermal spraying, the liquefied feedstock powder is deposited at a thickness of 5 μm to 20 μm.

4. The thermal spraying method according to claim 1, wherein the mask is a physical mask disposed to form an opening corresponding to a part or an entirety of the surface of the resin layer, or a coating mask that is coated to form an opening corresponding to an entirety of the surface of the resin layer.

5. The thermal spraying method according to claim 1, wherein the feedstock powder is inorganic metal material including metal oxide or metal nitride.

6. The thermal spraying method according to claim 5, wherein the feedstock powder is alumina ($Al_2O_3$) or yttria ($Y_2O_3$).

7. The thermal spraying method according to claim 1, wherein the component includes an electrostatic chuck or an upper electrode.

8. A method of thermal spraying a component for a plasma processing apparatus performed by a plasma spraying apparatus including a nozzle and a plasma generating unit having a common axis with the nozzle, the plasma generating unit including a plurality of gas supply paths configured to supply, into the plasma generating unit, Ar gas in a direction perpendicular to the nozzle, in order to generate a rotational flow in the plasma generating unit, the method comprising:
    injecting, with a plasma generating gas, feedstock powder having a particle diameter of 15 μm or less from a tip of the nozzle to the plasma generating unit;
    supplying Ar gas from the plurality of gas supply paths into the plasma generating unit to generate the rotational flow in the plasma generating unit;
    generating a plasma from the plasma generating gas in the plasma generating unit, by using electric power not more than 50 kW; and
    thermal spraying the feedstock powder liquefied by the plasma at a concave portion defined by the component, an electrostatic chuck and a resin layer provided between the component and the electrostatic chuck through a mask, such that a surface of the resin layer that is exposed to the concave portion between the component and the electrostatic chuck is in close contact with the feedstock powder; wherein
        the mask is a coating mask that is coated to form an opening corresponding to an entirety of the surface of the resin layer,
        the resin layer of the component is exposed on a side surface of the component,
        the component is placed on a turn table such that the side surface of the component faces outward in a radial direction of the turn table, and
        the liquefied feedstock powder is sprayed toward the component on the turn table in a direction perpendicular to a central axis of the turn table while rotating the turn table, thereby to cover the resin layer exposed on the side surface of the component with the feedstock powder in a circumferential direction of the component.

9. The thermal spraying method according to claim 8, wherein, in the thermal spraying, the liquefied feedstock powder is deposited at a width of 100 μm to 1000 μm.

10. The thermal spraying method according to claim 8, wherein, in the thermal spraying, the liquefied feedstock powder is deposited at a thickness of 5 μm to 20 μm.

11. The thermal spraying method according to claim 8, wherein the feedstock powder is inorganic metal material including metal oxide or metal nitride.

12. The thermal spraying method according to claim 11, wherein the feedstock powder is alumina ($Al_2O_3$) or yttria ($Y_2O_3$).

13. The thermal spraying method according to claim 8, wherein the component includes an electrostatic chuck or an upper electrode.

14. A method of thermal spraying a component for a plasma processing apparatus performed by a plasma spraying apparatus including a nozzle and a plasma generating unit having a common axis with the nozzle, the plasma generating unit including a plurality of gas supply paths configured to supply, into the plasma generating unit, Ar gas in a direction perpendicular to the nozzle, in order to generate a rotational flow in the plasma generating unit, the method comprising:

injecting, with a plasma generating gas, feedstock powder of alumina ($Al_2O_3$) or yttria ($Y_2O_3$) having a particle diameter of 15 μm or less from a tip of the nozzle to the plasma generating unit;

supplying Ar gas from the plurality of gas supply paths into the plasma generating unit to generate the rotational flow in the plasma generating unit;

generating a plasma from the plasma generating gas in the plasma generating unit, by using electric power not more than 50 kW; and thermal spraying the feedstock powder liquefied by the plasma at a concave portion defined by the component, an electrostatic chuck and a resin layer provided between the component and the electrostatic chuck through a mask, such that a surface of the resin layer that is exposed to the concave portion between the component and the electrostatic chuck is in close contact with the feedstock powder and that the feedstock powder is deposited at a width of 100 μm to 1000 μm and at a thickness of 5 μm to 20 μm; wherein the component includes an electrostatic chuck or an upper electrode, the component is placed on a turn table such that the side surface of the component faces outward in a radial direction of the turn table, the liquefied feedstock powder is sprayed toward the component on the turn table in a direction perpendicular to a central axis of the turn table while rotating the turn table, thereby to cover the resin layer exposed on the side surface of the component with the feedstock powder in a circumferential direction of the component, and the mask is a coating mask that is coated to form an opening corresponding to an entirety of the surface of the resin layer.

\* \* \* \* \*